United States Patent
Karhade et al.

(10) Patent No.: US 12,272,650 B2
(45) Date of Patent: Apr. 8, 2025

(54) MICROELECTRONIC PACKAGE WITH SUBSTRATE CAVITY FOR BRIDGE-ATTACH

(71) Applicant: Intel Corporation, Santa Clara, CA (US)

(72) Inventors: Omkar G. Karhade, Chandler, AZ (US); Debendra Mallik, Chandler, AZ (US); Nitin A. Deshpande, Chandler, AZ (US); Amruthavalli Pallavi Alur, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 950 days.

(21) Appl. No.: 16/804,835

(22) Filed: Feb. 28, 2020

(65) Prior Publication Data

US 2021/0272905 A1 Sep. 2, 2021

(51) Int. Cl.
| | |
|---|---|
| *H01L 23/538* | (2006.01) |
| *H01L 23/00* | (2006.01) |
| *H01L 23/13* | (2006.01) |
| *H01L 23/498* | (2006.01) |
| *H01L 23/522* | (2006.01) |

(52) U.S. Cl.
CPC .......... *H01L 23/5381* (2013.01); *H01L 23/13* (2013.01); *H01L 23/49816* (2013.01); *H01L 23/5226* (2013.01); *H01L 24/13* (2013.01)

(58) Field of Classification Search
CPC .......... H01L 23/5381; H01L 23/49816; H01L 23/5226; H01L 24/13; H01L 21/563
See application file for complete search history.

(56) References Cited

U.S. PATENT DOCUMENTS

| | | | |
|---|---|---|---|
| 5,858,254 A * | 1/1999 | Balzer | H05K 3/467 |
| | | | 430/311 |
| 6,183,267 B1 | 2/2001 | Marcus et al. | |
| 6,521,970 B1 | 2/2003 | Takiar et al. | |
| 7,909,657 B1 | 3/2011 | Abughazaleh et al. | |
| 9,549,468 B1 | 1/2017 | Tsai et al. | |
| 9,754,890 B2 | 9/2017 | Deshpande et al. | |
| 9,818,736 B1 | 11/2017 | Orikasa et al. | |
| 10,163,798 B1 | 12/2018 | Alur et al. | |
| 10,535,608 B1 | 1/2020 | Rubin et al. | |
| 10,861,767 B2 | 12/2020 | Prajuckamol et al. | |
| 11,094,637 B2 | 8/2021 | Rubin et al. | |
| 11,177,156 B2 | 11/2021 | Yang et al. | |
| 11,289,412 B2 * | 3/2022 | Williamson | H01L 21/4857 |
| 11,373,972 B2 | 6/2022 | Karhade et al. | |
| 11,521,931 B2 | 12/2022 | Gamba et al. | |
| 2003/0057551 A1 * | 3/2003 | Datta | H01L 24/05 |
| | | | 257/737 |
| 2004/0036152 A1 | 2/2004 | Harper et al. | |

(Continued)

FOREIGN PATENT DOCUMENTS

WO 2019132965 A1 7/2019

*Primary Examiner* — Phat X Cao
(74) *Attorney, Agent, or Firm* — Akona IP PC

(57) ABSTRACT

Embodiments may relate to a microelectronic package that includes a substrate with a cavity therein. A component may be positioned within the substrate, and exposed by the cavity. A solder bump may be positioned within the cavity and coupled with the component, and a bridge die may be coupled with the solder bump. Other embodiments may be described or claimed.

16 Claims, 7 Drawing Sheets

(56) References Cited

U.S. PATENT DOCUMENTS

| | | |
|---|---|---|
| 2005/0012221 A1 | 1/2005 | Kirby et al. |
| 2006/0033172 A1 | 2/2006 | Muthukumar et al. |
| 2006/0038289 A1 | 2/2006 | Hsu et al. |
| 2007/0158816 A1 | 7/2007 | Chow et al. |
| 2007/0222087 A1 | 9/2007 | Lee et al. |
| 2007/0232053 A1 | 10/2007 | Lee et al. |
| 2009/0042336 A1 | 2/2009 | Paik et al. |
| 2010/0013092 A1 | 1/2010 | Eda |
| 2011/0177311 A1 | 7/2011 | Manabe et al. |
| 2011/0278718 A1 | 11/2011 | Thacker et al. |
| 2012/0234589 A1* | 9/2012 | Furuichi ........... H01L 23/49822 29/837 |
| 2012/0261838 A1 | 10/2012 | Braunisch et al. |
| 2013/0154127 A1 | 6/2013 | Chow et al. |
| 2014/0065771 A1 | 3/2014 | Gruber et al. |
| 2014/0319522 A1* | 10/2014 | Daubenspeck ........ H01L 24/03 257/737 |
| 2015/0194373 A1 | 7/2015 | Otremba et al. |
| 2016/0129530 A1 | 5/2016 | Greve et al. |
| 2016/0336249 A1 | 11/2016 | Kang et al. |
| 2016/0343666 A1* | 11/2016 | Deshpande ......... H01L 23/5383 |
| 2016/0379923 A1 | 12/2016 | Zhang et al. |
| 2018/0047693 A1 | 2/2018 | Raravikar et al. |
| 2018/0076103 A1 | 3/2018 | Jeon et al. |
| 2018/0158802 A1* | 6/2018 | Yeh .................... H01L 25/0655 |
| 2018/0350734 A1 | 12/2018 | Lee et al. |
| 2019/0005180 A1 | 1/2019 | Yeh et al. |
| 2019/0157240 A1 | 5/2019 | Tsai et al. |
| 2019/0164879 A1 | 5/2019 | Kanbe |
| 2019/0371781 A1 | 12/2019 | Huang et al. |
| 2019/0393121 A1 | 12/2019 | Swaminathan et al. |
| 2020/0035603 A1 | 1/2020 | Rubin et al. |
| 2020/0161279 A1 | 5/2020 | Mok |
| 2020/0185292 A1 | 6/2020 | Kwon et al. |
| 2020/0273840 A1 | 8/2020 | Elsherbini et al. |
| 2021/0134728 A1 | 5/2021 | Rubin et al. |
| 2021/0183753 A1* | 6/2021 | Sakuma ................ H01L 24/73 |
| 2021/0193582 A1 | 6/2021 | Yu et al. |
| 2021/0202394 A1* | 7/2021 | Lin .................... H01L 23/5386 |
| 2021/0265275 A1* | 8/2021 | Rubin ................ H01L 23/5381 |
| 2021/0272881 A1 | 9/2021 | Vaidya et al. |
| 2021/0272905 A1 | 9/2021 | Karhade et al. |
| 2021/0305132 A1 | 9/2021 | Karhade et al. |
| 2021/0313299 A1 | 10/2021 | Tsai et al. |
| 2021/0391263 A1 | 12/2021 | Nie et al. |
| 2021/0391264 A1 | 12/2021 | Nie et al. |
| 2021/0391266 A1 | 12/2021 | Gamba et al. |
| 2021/0391268 A1 | 12/2021 | Karhade et al. |
| 2021/0391273 A1 | 12/2021 | Dubey et al. |
| 2021/0391294 A1 | 12/2021 | Karhade et al. |

* cited by examiner

MICROELECTRONIC PACKAGE WITH SUBSTRATE CAVITY FOR BRIDGE-ATTACH

BACKGROUND

In some microelectronic packages, it may be desirable to use a bridge to connect various elements of the microelectronic package together. However, some bridges may be external to the substrate. Additionally, those bridges may lack surface routing on top of the bridge.

DETAILED DESCRIPTION

Figure 1:
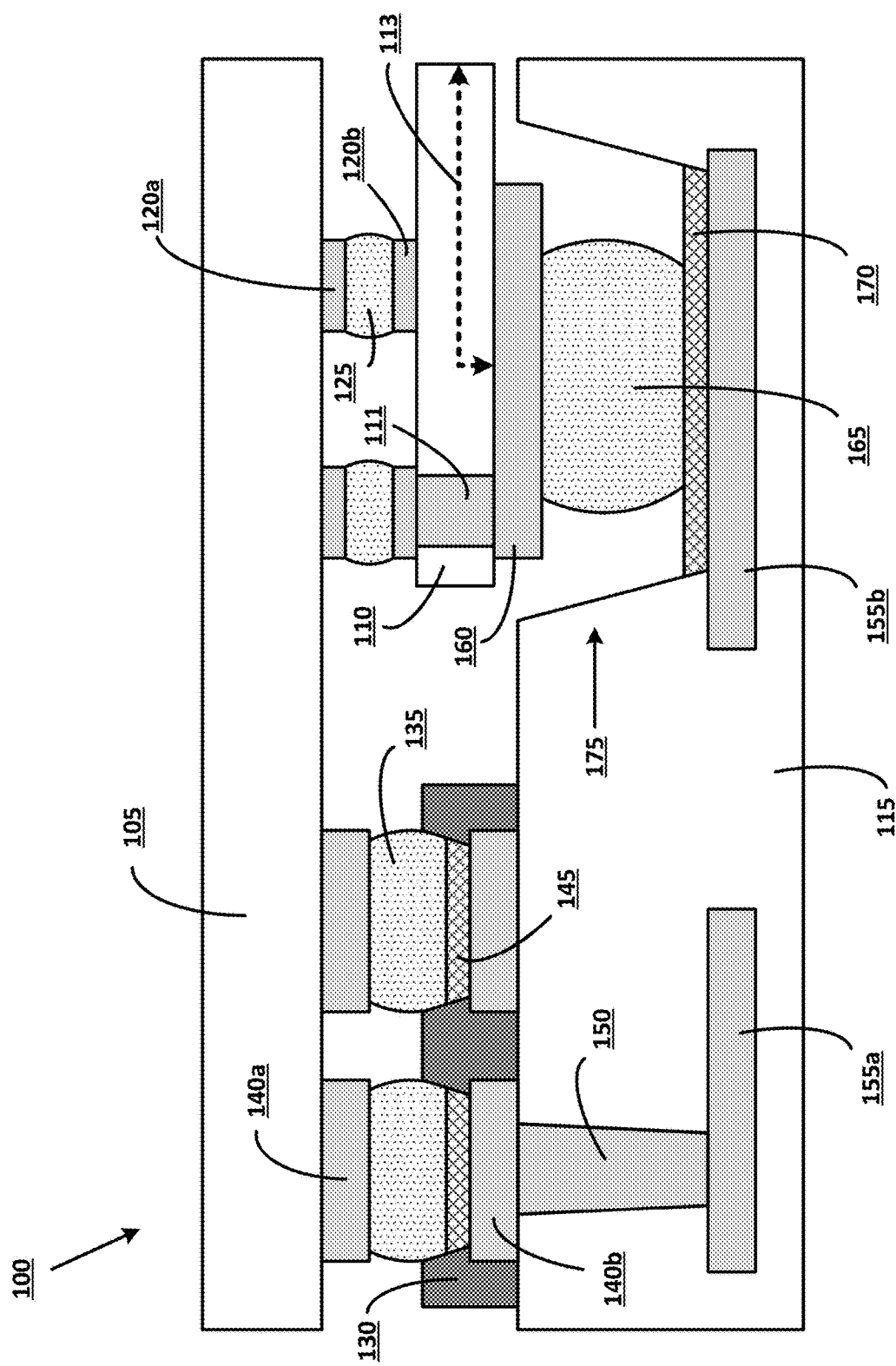
FIG. 1 depicts an example microelectronic package with a bridge coupled with an inner layer of the package substrate, in accordance with various embodiments.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense.

For the purposes of the present disclosure, the phrase "A or B" means (A), (B), or (A and B). For the purposes of the present disclosure, the phrase "A, B, or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or elements are in direct contact.

In various embodiments, the phrase "a first feature on a second feature," may mean that the first feature is formed/deposited/disposed/etc. over the feature layer, and at least a part of the first feature may be in direct contact (e.g., direct physical or electrical contact) or indirect contact (e.g., having one or more other features between the first feature and the second feature) with at least a part of the second feature.

Various operations may be described as multiple discrete operations in turn, in a manner that is most helpful in understanding the claimed subject matter. However, the order of description should not be construed as to imply that these operations are necessarily order dependent.

Embodiments herein may be described with respect to various Figures. Unless explicitly stated, the dimensions of the Figures are intended to be simplified illustrative examples, rather than depictions of relative dimensions. For example, various lengths/widths/heights of elements in the Figures may not be drawn to scale unless indicated otherwise. Additionally, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined, e.g., using scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication.

As noted, it may be desirable to use a bridge to connect various elements of a microelectronic package together. Open-cavity bridge architecture for connected multiple dies may offer a low-cost/high-bandwidth solution. However, in may cases an OCB bridge may not have surface routing on top of the bridge like may exist in other bridges.

Some legacy solutions to this concern have involved using a conductive adhesive or solder to connect the bridge and component inside of the substrate. However, this technique may allow only the use of a single pad (e.g., ground or power). Additionally, because the pad layer may be used as an etch stop, it may be difficult to provide discontinuities in the inner-substrate layers. Another technique may involve placing both the bridge and a component to which the bridge is coupled on the surface of the substrate. However, this technique may significantly increase the z-height of the package, may be difficult to manufacture, and may not be cost-effective.

Embodiments herein relate to a configuration which may address one or more of the above-described concerns. Specifically, in some embodiments, the substrate material over the N-1 layer (e.g., in the N layer) may be patterned to form one or more openings through which the N-1 layer may be exposed. Power or input/output (I/O) routing for the bridge and one or more components of the microelectronic package may be done at the N-1 layer. The bridge and component of the microelectronic package may be communicatively or physically coupled by one or more solder bumps that are place in the patterned cavity of the N layer.

Embodiments herein may provide a number of advantages over legacy configurations. For example, embodiments herein may enable the use of a bridge with minimal added manufacturing steps. Additionally, embodiments may allow for relatively tight-pitch power or I/O connections on the bottom side of the bridge between the bridge and a component of the N-1 layer of the package substrate.

FIG. 1 depicts an example microelectronic package 100 with a bridge 110 coupled with an inner layer of the package substrate 115, in accordance with various embodiments. It will be understood that Figures herein are intended as highly simplified examples, and other embodiments may include more or fewer elements than are depicted in the Figures, or elements in a different arrangement. It will be further understood that, unless explicitly stated, the relative dimensions of certain of the elements of the Figures are depicted for the sake of discussion and explanation, and are not intended to definitely shown the dimensions of one element to another. It will further be understood that each and every element of the Figures may not be explicitly enumerated for the sake of lack of redundancy of the Figures. However, elements that are depicted as having similar characteristics or being in the same position as one another either within in a Figure or between different Figures may be presumed to have features or characteristics that are similar to one another unless stated otherwise. For example, each and every pad or interconnect may not be specifically enumerated in each Figure or between different Figures.

The microelectronic package 100 may include an active die 105. The active die 105 may be, for example may be or include, for example, a processor such as a central processing unit (CPU), general processing unit (GPU), a core of a distributed processor, or some other type of processor. Alternatively, the active die 105 may be include a memory such as a double data rate (DDR) memory, a nonvolatile memory (NVM), a volatile memory, a read-only memory (ROM), or some other type of memory or die. In some embodiments the active die 105 may be or include a radio frequency (RF) chip or RF circuitry that is configured to generate, process, transmit, or receive a wireless signal such as a third generation (3G), a fourth generation (4G), a fifth generation (5G), a Wi-Fi, or some other type of wireless signal. In some embodiments the active die 105 may include one or more passive components such as capacitors, resistors, etc. The various active or passive components may be positioned within, partially within, or on the surface of the active die 105.

The active die 105 may be coupled with a substrate 115, which may also be referred to as a package substrate. The substrate 115 may be, for example, considered to be a cored or coreless substrate. The substrate 115 may include one or more layers of a dielectric material which may be organic or inorganic. The substrate 115 may further include one or more conductive elements such as vias, pads, traces, microstrips, striplines, etc. The conductive elements may be internal to, or on the surface of, the substrate 115. Generally, the conductive elements may allow for the routing of signals through the substrate 115, or between elements that are coupled to the substrate 115. In some embodiments the substrate 115 may be, for example, a printed circuit board (PCB), an interposer, a motherboard, or some other type of substrate.

As noted, the substrate 115 may include a plurality of metal layers. Two such layers are depicted in FIG. 1; however, it will be understood that in other embodiments the substrate 115 may have more metal layers than the two depicted. The two depicted metal layers are an outer N layer and an inner N-1 layer. Specifically, the outer N layer may be located flush with, partially protruding from, or coupled to the surface of the substrate 115. The inner N-1 layer may be positioned within the substrate 115. As noted, the substrate 115 may have more metal layers than depicted such as an N-2 layer that is adjacent to the N-1 layer such that the N-1 layer is between the N layer and the N-2 layer.

As noted, various of the layers may have components positioned either in or on the layers. Two such components 155a and 155b are depicted in the N-1 layer of the substrate 115 of FIG. 1. In some embodiments, one or more of the components 155a and 155b may be conductive elements such as pads/traces/etc. (or a combination thereof) that allow communication between two electronic elements of the microelectronic package 100. In some embodiments, although not explicitly shown in FIG. 1, the components 155a and 155b may be a single conductive element that allows communication between the bridge 110 and the active die 105 as described in further detail below. In other embodiments, one or both of the components 155a and 155b may be some other component of the microelectronic package 100 such as an active element (e.g., a logic, memory, etc.), a passive element or circuit, or some other component of the N-1 layer of the substrate 115.

The microelectronic package 100 may further include a bridge 110. Generally, the bridge 110 may allow communication of an electrical signal (e.g., a power signal, a data signal, etc.) between the microelectronic package 100 (or an element thereof) and another component of an electronic device to which the bridge 110 is coupled along a communication pathway 113. For example, as will be described later, the bridge 110, and particularly the communication pathway 113, may be coupled with an interconnect 165 which in turn is communicatively coupled with component 155b. In real-world embodiments, the bridge 110 may be coupled with another interconnect at another portion of the bridge 110, which in may turn be coupled with an additional component. In this embodiment, the bridge 110, and specifically the communication pathway 113, may allow communication between component 155b and the additional component to which the other interconnect is coupled at the other portion of the bridge 110. These additional components and couplings are not shown for the sake of succinctness of the Figures and for lack of redundancy.

The communication pathway 113 may include one or more optically or electrically conductive elements. In some embodiments, the bridge 110 may be an active bridge (e.g., including one or more elements that process or otherwise affect a signal that the bridge 110 is conveying) or a passive bridge (e.g., not processing or otherwise affecting the signal). As may be noted, the communication pathway 113 may be coupled with the bottom of the bridge 110 (as oriented in FIG. 1) rather than the top of the bridge 110. In some embodiments, the communication pathway 113 may be generally inside of the bridge 110, as depicted, however in other embodiments the communication pathway 113 may be at or on the surface of the bridge 110. In some embodiments, the bridge 110 may additionally include one or more communication pathways coupled with the top or sides of the bridge 110.

The active die 105 may be coupled with the substrate 115 by one or more interconnects 135. As shown in FIG. 1, the interconnects 135 may be, for example, solder bumps that are formed of a material such as tin, silver, copper, etc. If solder bumps are used for the interconnects 135, then the solder bumps may be elements of a ball grid array (BGA). In other embodiments, the interconnects 135 may be pins of a pin grid array (PGA), elements of a land grid array (LGA), or some other type of interconnect. Generally, the interconnects 135 may physically or communicatively couple the active die 105 with the substrate 115. For example, one or more of the interconnects 135 may physically couple with, and allow electrical signals to pass between, pads 140*a* of the active die 105 and pads 140*b* (which may be considered to be pads of the N layer of the substrate 115). The pads 140*a*/140*b* may be formed of an electrically conductive material such as copper, gold, etc. In other embodiments, the interconnects 135 may physically couple the active die 105 and the substrate 115, but the interconnects 135 may not communicatively couple the die 105 and the substrate 115. In some embodiments, certain of the pads such as the pads 140*b* of the substrate 115 may include a surface finish 145 which may be, for example, nickel palladium gold (NiPaAu) or some other surface finish. The surface finish 145 may generally be to improve the mechanical or electrical properties of the intermetallic formed between an interconnect such as interconnects 135 and a pad such as pad 140*b*.

In some embodiments, the microelectronic package 100 may further include a solder-resist layer 130. The solder-resist layer 130 may include one or more openings in which the interconnects 135 are positioned. The solder-resist layer 130 may be formed of a material such as polymer or some other material. Generally, the solder-resist layer 130 may limit the spreading of the interconnects 135 during reflow so that the interconnects 135 do not come in contact with one another and cause an undesirable short in the microelectronic package.

As may be seen, the active die 105 may be communicatively coupled with a component 155*a* of the substrate 115 by a via 150. Specifically, the via 150 may be a plated via which is formed by plating a hole that is drilled or etched in the substrate 115. Specifically, the via 150 may allow electrical coupling of the active die 105 (by way of pads 140*a*/140*b*, interconnect 135, and surface finish 145) to the component 155*a*. Specifically, the via 150 may allow communication between an element of the N-1 layer of the substrate 115 (e.g., the component 155*a*) and an element of the N layer of the substrate 115 (e.g., the pad 140*b*).

In some embodiments, the active die 105 may at least partially overlap the bridge 110 as shown. In this embodiment, it may be desirable to physically couple the active die 105 with the bridge 110 as shown. For example, such a coupling may be desirable from a structural standpoint to provide stability for the microelectronic package 100. In this embodiment, the active die 105 may be coupled with the bridge by one or more interconnects 125, which may be similar to, and share one or more characteristics with, interconnects 135. The coupling may further include one or more die-side pads 120*a* which may be similar to, and share one or more characteristics with, pads 140*a*. The coupling may further include one or more bridge-side pads 120*b* which may be similar to, and share one or more characteristics with, pads 140*b*.

It will be understood that in some embodiments, pads 120*a*/120*b*/140*a*/140*b* may be of the same material as one another, while in other embodiments one or more of the pads 120*a*/120*b*/140*a*/140*b* may be formed of a different material than another of the pads. Additionally, as can be seen in FIG. 1, pads 120*a*/120*b* may be smaller than pads 140*a*/140*b*, and interconnect 125 may be smaller than interconnect 135. However, in other embodiments various of the pads or interconnects may be sized or shaped differently than one another.

In some embodiments the substrate 115 may include a cavity 175. The cavity 175 may be formed by, for example, mechanical drilling, etching, photolithography, laser-exposure, etc. As may be seen, the cavity 175 may expose component 155*b* in the N-1 layer. It will be understood that although only the N-1 layer is described herein as being exposed, in other embodiments additional or alternative layers such as an N-2 layer, an N-3 layer, etc. may be exposed through similar techniques as described herein.

The cavity 175 may include a surface finish 170 positioned on the component 155*b*. The surface finish 170 may be similar to, and share one or more characteristics of, surface finish 145. In some embodiments surface finish 145 and surface finish 170 may be formed of the same material, while in other embodiments they may be formed of different materials.

The bridge 110, and particularly the communication pathway 113 of the bridge 110 may be communicatively coupled with the component 155*b* by an interconnect 165 that is positioned in the cavity 175. The interconnect 165 may be similar to, and share one or more characteristics of, interconnects 135 or 125. In some embodiments, the interconnect 165 may be of the same material or the same type as one of interconnects 135 or 125, while in other embodiments the interconnect 165 may be formed of a different material or be a different type of interconnect than interconnects 135 or 125. For example, interconnect 125 may be a solder bump while interconnect 165 may be a pin of a PGA. Although the interconnect 165 is shown as larger than interconnects 135 or 125, in other embodiments interconnect 165 may be the same size as, or smaller than, one of the other interconnects 125/135.

In some embodiments the interconnect 165 may be coupled with the bridge 110 by a pad 160 which may be similar to, and share one or more characteristics with, one of pads 140*a*/140*b*/120*a*/120*b*. For example, in some embodiments the pad 160 may be of a same size, shape, or material as another of the pads. In other embodiments, the pad 160 may be of a different size, shape, or material as another of the pads. In some embodiments, the pad 160 may be communicatively coupled with one of pads 120*b* (and, through the pads 120*a*/120*b* and the interconnect 125, to the active die 105) through a via 111. The via 111 may be formed of a conductive material that allows communication through the bridge 110 between two elements communicatively coupled to opposite sides of the bridge.

In the embodiment of FIG. 1, the interconnect 165 may be coupled with the bridge 110 (or, particularly, the pad 160) and then placed into cavity 175 where reflow may then be performed to couple the interconnect 165 with the substrate 115. In this embodiment, there may be space between one or both sides of the interconnect 165 and the substrate 115 as shown in FIG. 1.

Figure 2:
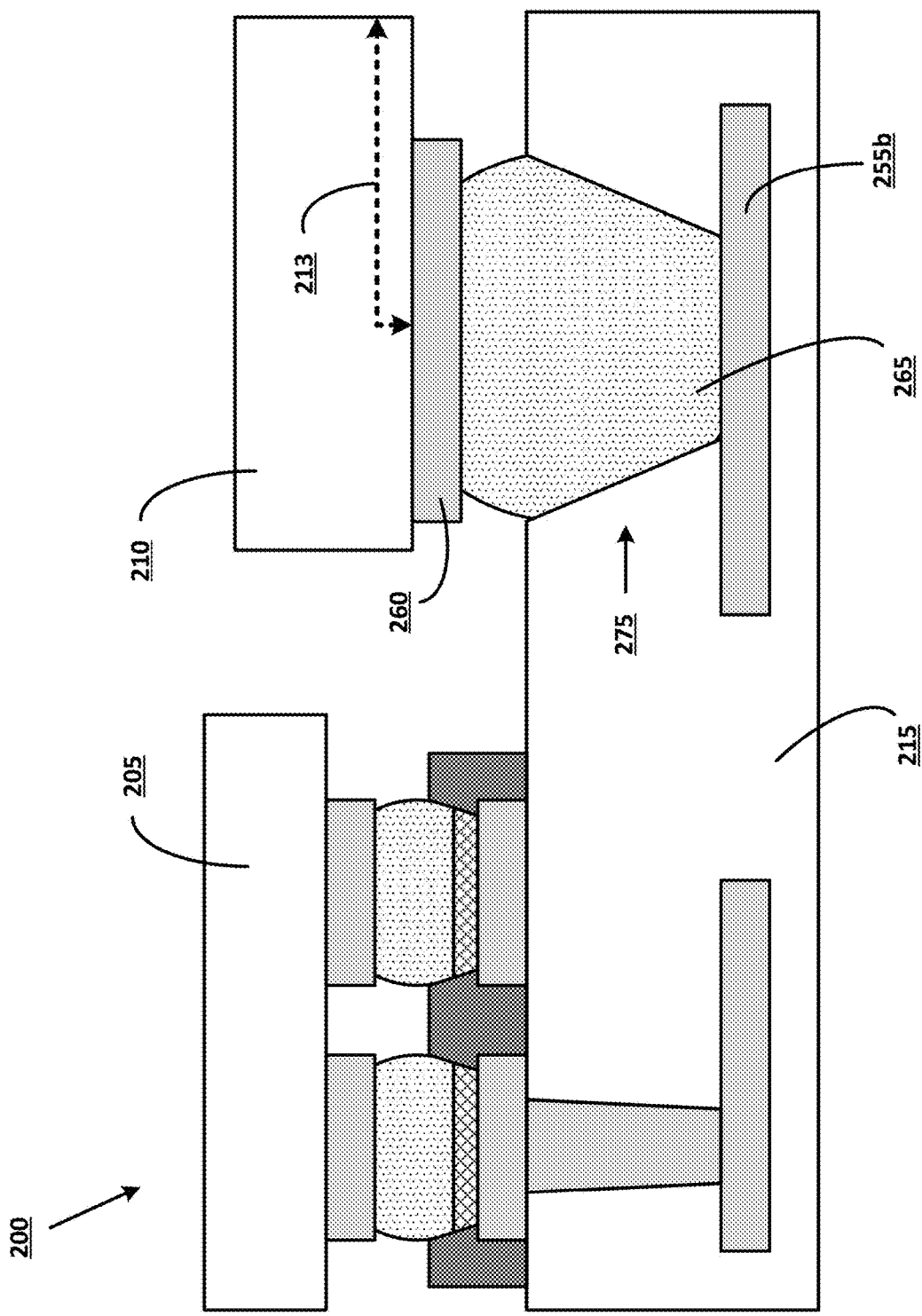
FIG. 2 depicts an alternative example microelectronic package with a bridge coupled with an inner layer of the package substrate, in accordance with various embodiments.

FIG. 2 depicts an alternative example microelectronic package 200 with a bridge 210 coupled with an inner layer of the package substrate, in accordance with various embodiments. The microelectronic package 200 may include an active die 205, a bridge 210 with a communication pathway 213, and a substrate 215 which may be respectively similar to, and share one or more characteristics with, active die 105, bridge 110, communication pathway 113, and substrate 115. The substrate 215 may further include a cavity 275 and a component 255*b* which may be respectively similar to, and share one or more characteristics with, cavity 175, and component 155*b*. The bridge 210 may be communicatively and physically coupled with the substrate 115, and particularly component 255*b*, by an interconnect 265 and a pad 260 which may be respectively similar to, and share one or more characteristics with, interconnect 165 and pad 160.

As may be seen in FIG. 2, certain elements that are present in the microelectronic package 100 may not be present in the microelectronic package 200. For example, the component 255*b* may not include a surface finish such as surface finish 170. However, it will be understood that in other embodiments that element (or other elements) may be present. More specifically, various embodiments of this disclosure may include aspects or elements of various embodiments depicted herein.

It will also be seen that in FIG. 2 the active die 205 may not overlap the bridge 210. In this embodiment, the active die 205 and the bridge 210 may be considered to be more adjacent to one another rather than overlapping.

It will also be seen in FIG. 2 that the interconnect 265 may substantially fill the cavity 275. This may occur if, for example, the solder bump is first placed in the cavity 275 and reflow is performed to adhere the interconnect 265 to the component 255*b* prior to coupling the substrate 215 to the bridge 210. However, in other embodiments this specific arrangement may result from the use of a solder bump that is a different size than the solder bump used in microelectronic package 100, a different reflow process, etc. Generally, the specific order in which elements are coupled together may be based on a variety of factors such as use cases of the microelectronic package, specific materials used, manufacturing or design considerations, etc.

Figure 3:
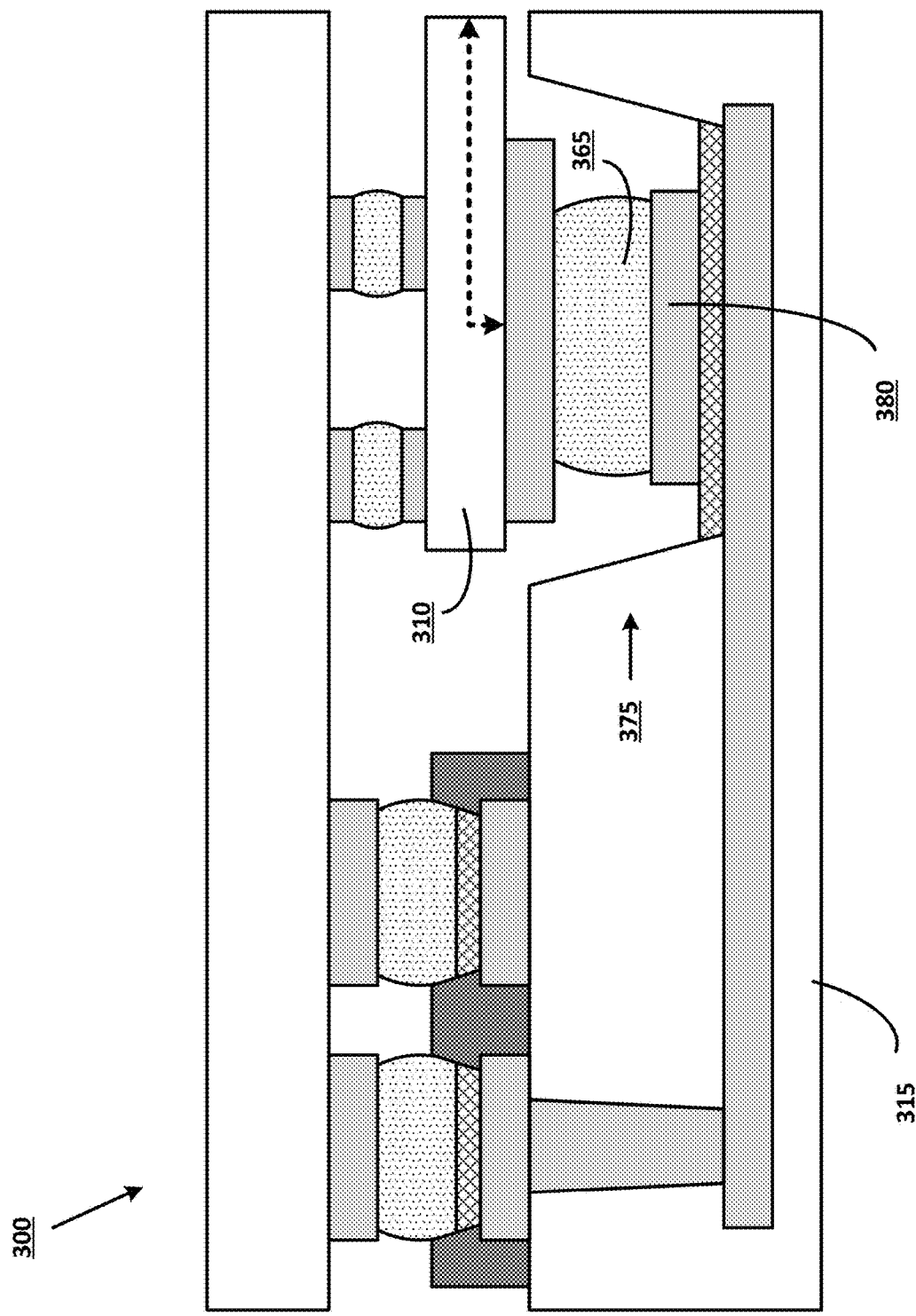
FIG. 3 depicts an alternative example microelectronic package with a bridge coupled with an inner layer of the package substrate, in accordance with various embodiments.

FIG. 3 depicts an alternative example microelectronic package 300 with a bridge 310 coupled with an inner layer of the package substrate 315, in accordance with various embodiments. Specifically, the microelectronic package 300 may include a bridge 310 and a substrate 315 which may be respectively similar to, and share one or more characteristics with, bridge 110 and substrate 115. The substrate 315 may include a cavity 375 with an interconnect 365 positioned therein, which may be respectively similar to cavity 175 and interconnect 165.

The microelectronic package 300 may include a substrate-side pad 380, which may be similar to one of pads 140*a*/140*b*/120*a*/120*b*/160, or some other pad depicted or discussed herein. In some embodiments, the pad 380 may be desirable to control the spread of the interconnect 365 during a reflow process wherein the interconnect 365 is communicatively and physically coupled with one or both of the substrate 315 and the bridge 310.

As will be noted, embodiments herein may have a variety of characteristics or features. Generally, the characteristics or features may be described with respect to elements of FIG. 1, however it will be understood that the features may be present in other embodiments as well. One such feature may be that the substrate 115 may be patterned to expose the N-1 layer as described above. Additionally, in some embodiments the component 155*b* may have a same surface finish 170 as the surface finish 145 on pads 140*b*, while in other embodiments surface finish 170 may be different than surface finish 145. Additionally, the N-1 layer may be open to coupling with a bridge or component because of cavity 175. Additionally, the bridge 110 may or may not be coupled with an active die such as active die 105. In some embodiments, the interconnects 165 may be placed as microballs with a 100 micrometer ("micron") pitch which is then reflowed. In other embodiments, the interconnects 165 may be plated. In some embodiments, the active die 105 may have a core-to-bridge-height different to accommodate the z-height of the bridge 110. It will be noted that this description includes examples of some characteristics, which may vary in other embodiments. Additionally, as noted, certain additional elements of the microelectronic packages may not be shown in the various Figures such as additional active elements, passive elements, conductive elements, etc. Additionally, additional structures such as heat spreaders, mold material, underfill, intermetallic compounds, etc. may be omitted from the Figures for the sake of clarity and succinctness of the Figure, however those elements may be present in various embodiments including real-world embodiments of the microelectronic packages discussed herein.

Figure 4:
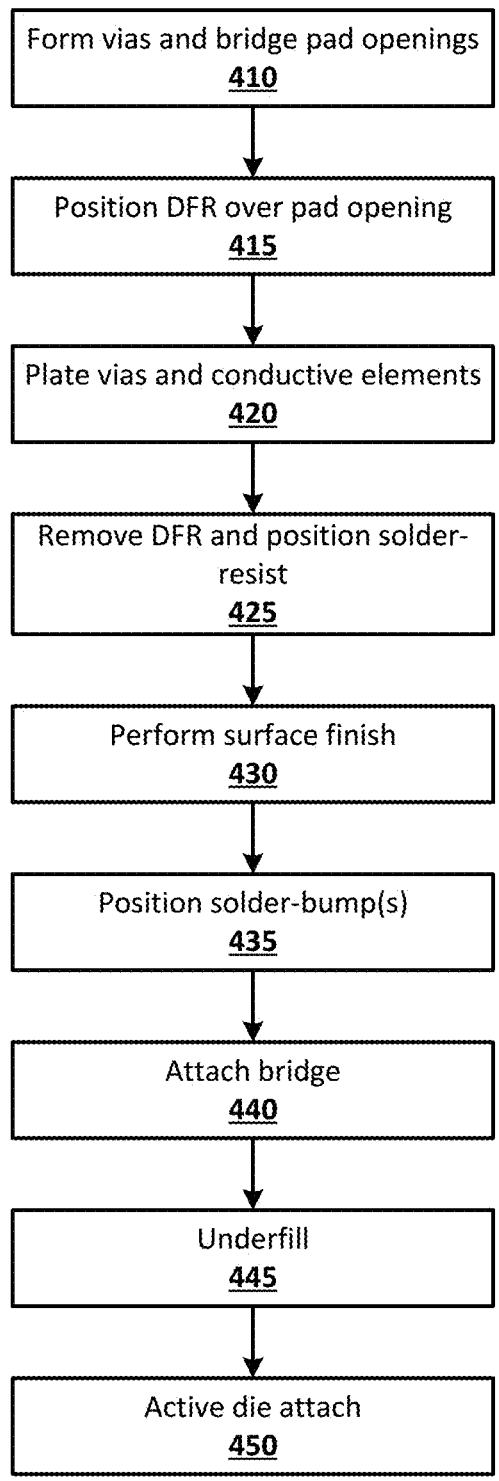
FIG. 4 depicts an example technique for forming a microelectronic package with a bridge coupled with an inner layer of the package substrate, in accordance with various embodiments.

FIG. 4 depicts an example technique for forming a microelectronic package with a bridge coupled with an inner layer of the package substrate, in accordance with various embodiments. Generally, the technique may be described with respect to elements of FIG. 1. However, it will be understood that the technique may be applicable, in whole or in part, with or without modification, to other embodiments herein. Additionally, it will be understood that although certain elements are shown as occurring in a specific order, in other embodiments certain elements may occur simultaneously with one another or in an order different than what is shown. Finally, it will be understood that in other embodiments the technique may include more or fewer elements than are depicted in FIG. 4.

The technique may include forming, at 410, vias and bridge pad openings. Specifically, the technique may include forming a cavity such as cavity 175 in the substrate, or forming a hole for the via 150. Forming the vias and bridge pad openings may include, for example, drilling, laser-etching, chemical etching, etc.

The technique may further include positioning, at 415, a dry film resist (DFR) over the openings (e.g., the via or the cavity). The DFR may be a material such as a polymer or some other material which may protect the openings from subsequent elements of the technique.

The technique may further include plating, at 420, vias or conductive elements. For example, the technique may include plating one or more pads such as pads 140*b* (or, in some embodiments, pad 380), or a via such as via 150.

The technique may further include removing, at 425, the DFR and positioning a solder-resist layer on the substrate. Removing the DFR may be performed through a chemical process, mechanical drilling or scraping, washing the DFR off of the substrate, etc. The solder-resist layer may be similar to, for example, solder-resist layer 130 which may be positioned on the substrate through a process such as deposition, lamination, etc.

The technique may further include performing, at 430, a surface finish. Specifically, the technique may include forming a surface finish such as elements 145 or 170. In some embodiments, the surface finish may be performed by a physical smoothing process, a chemical reaction, polishing, etc. In some embodiments, performing the surface finish may include plating nickel or gold, or some other material.

The technique may further include positioning solder bumps at 435. The solder bumps may be or include, for example, the solder bumps that will be reflowed to form interconnects 165 or 135.

The technique may further include attaching, at 440, a bridge such as bridge 110. For example, the bridge may be positioned such that it is physically coupled with the solder bump in the cavity of the substrate via a pick-and-place operation or some other operation. Reflow may then be performed so that the solder ball forms an interconnect such as interconnect 165 to physically and communicatively couple the bridge to the substrate.

An underfill may then be added at 445. The underfill may, for example, be positioned between the bridge and the substrate, between the active die and the bridge, or between the active die and the substrate. The underfill may provide structural support to the microelectronic package, or provide protection to elements of the microelectronic package from various factors such as temperature, pressure, humidity, electromagnetic interference, etc.

The active die may be attached at 450. In some embodiments, attach of the active die may be similar to that of the bridge. Specifically, the die may be positioned against the substrate or the bridge and reflow may be performed to form interconnects such as interconnects 135 or 125. In some embodiments, further underfill may then be introduced between the die and the substrate or between the die and the bridge.

Figure 5:
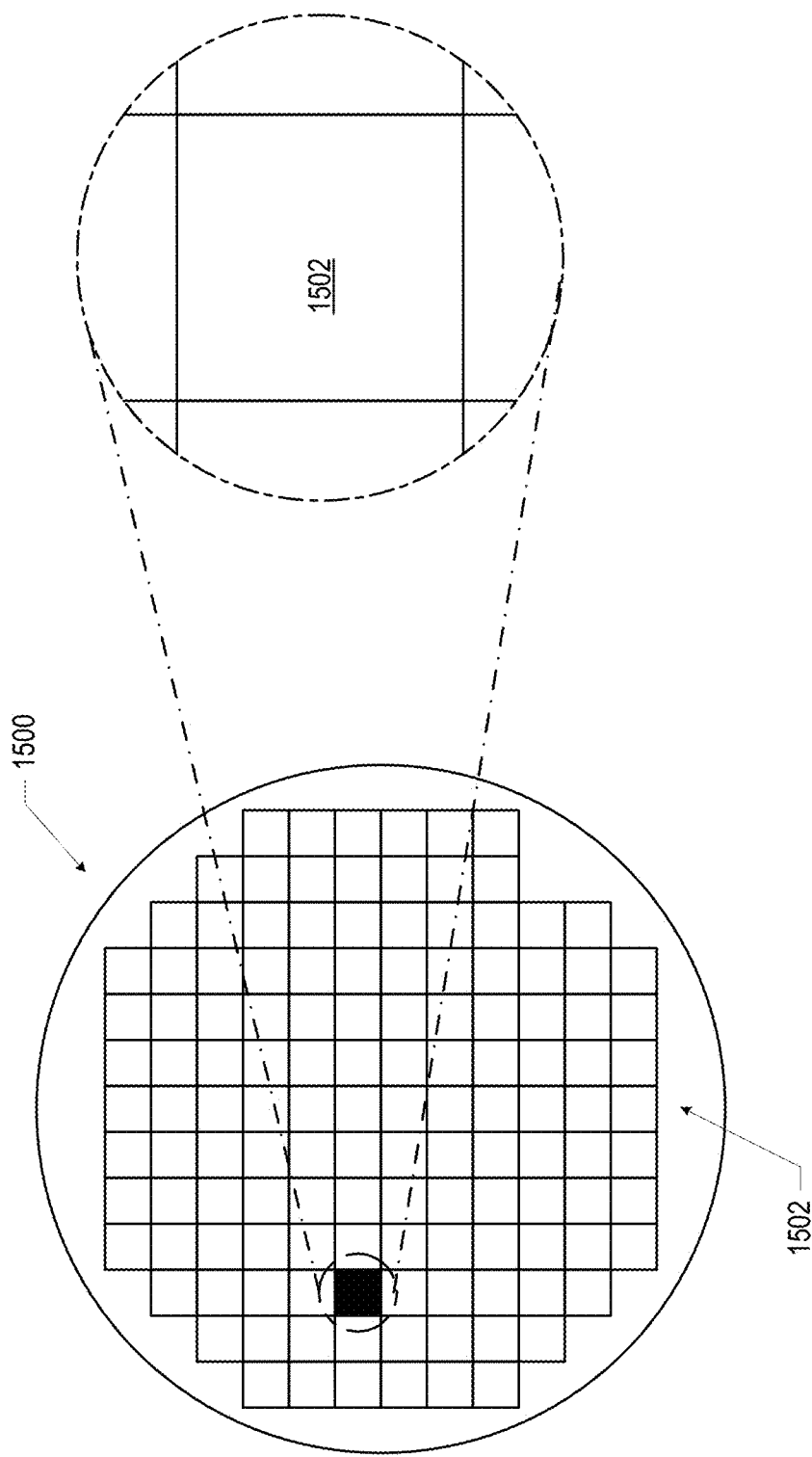
FIG. 5 is a top view of a wafer and dies that may include a microelectronic package with a bridge coupled with an inner layer of the package substrate, in accordance with various embodiments.

FIG. 5 is a top view of a wafer 1500 and dies 1502 that may include one or more microelectronic packages with a bridge coupled with an inner layer of the package substrate, or may be included in an IC package including one or more microelectronic packages with a bridge coupled with an inner layer of the package substrate in accordance with various embodiments. The wafer 1500 may be composed of semiconductor material and may include one or more dies 1502 having IC structures formed on a surface of the wafer 1500. Each of the dies 1502 may be a repeating unit of a semiconductor product that includes a suitable IC. After the fabrication of the semiconductor product is complete, the wafer 1500 may undergo a singulation process in which the dies 1502 are separated from one another to provide discrete "chips" of the semiconductor product. The die 1502 may include one or more microelectronic packages with a bridge coupled with an inner layer of the package substrate, one or more transistors or supporting circuitry to route electrical signals to the transistors, or some other IC component. In some embodiments, the wafer 1500 or the die 1502 may include a memory device (e.g., a random-access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 7) or other logic that is configured to store information in the memory devices or execute instructions stored in the memory array.

Figure 6:
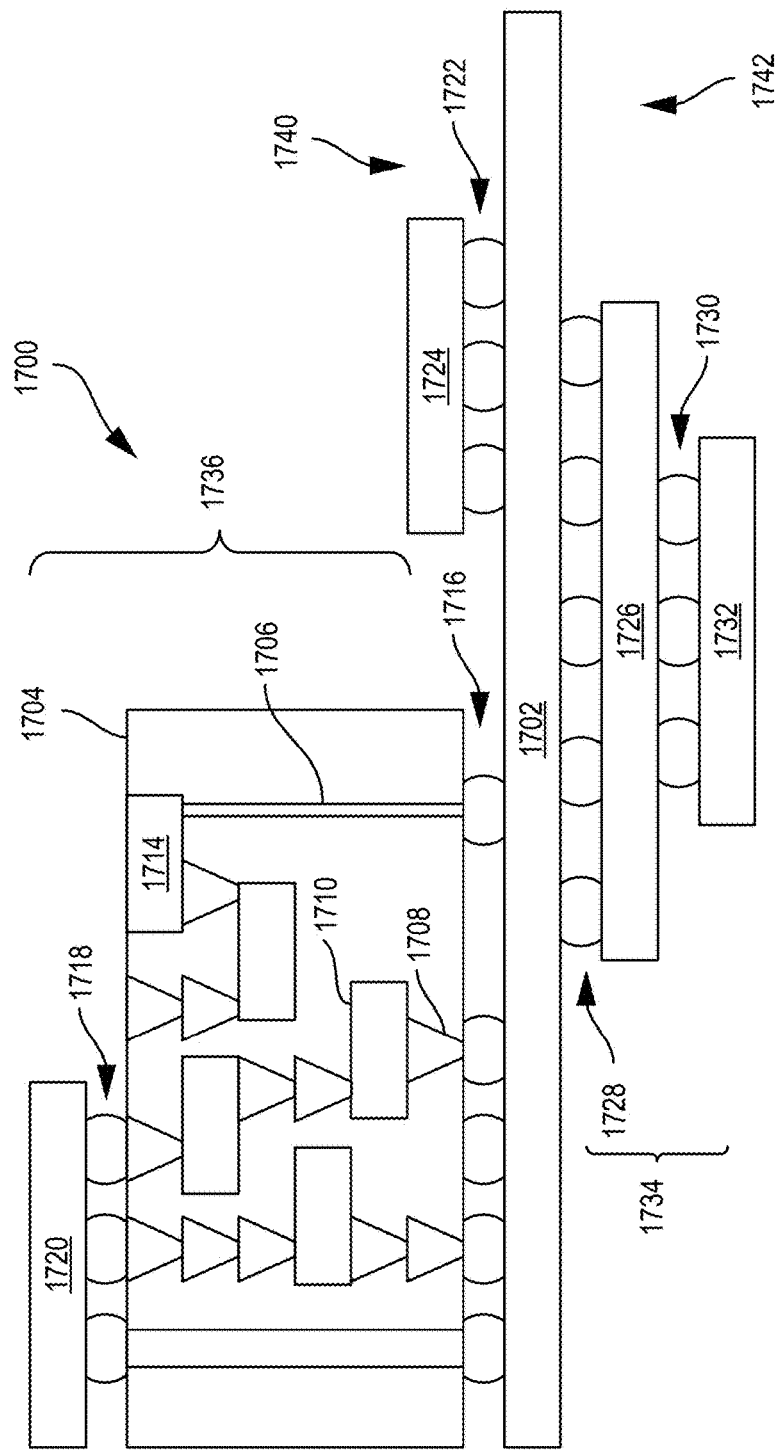
FIG. 6 is a side, cross-sectional view of an integrated circuit (IC) device assembly that may include a microelectronic package with a bridge coupled with an inner layer of the package substrate, in accordance with various embodiments.

FIG. 6 is a side, cross-sectional view of an IC device assembly 1700 that may include one or more IC packages or other electronic components (e.g., a die) including one or more microelectronic packages with a bridge coupled with an inner layer of the package substrate, in accordance with any of the embodiments disclosed herein. The IC device assembly 1700 includes a number of components disposed on a circuit board 1702 (which may be, e.g., a motherboard). The IC device assembly 1700 includes components disposed on a first face 1740 of the circuit board 1702 and an opposing second face 1742 of the circuit board 1702; generally, components may be disposed on one or both faces 1740 and 1742.

In some embodiments, the circuit board 1702 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate.

The IC device assembly 1700 illustrated in FIG. 6 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702, and may include solder balls (as shown in FIG. 6), male and female portions of a socket, an adhesive, an underfill material, and/or any other suitable electrical and/or mechanical coupling structure.

The package-on-interposer structure 1736 may include an IC package 1720 coupled to a package interposer 1704 by coupling components 1718. The coupling components 1718 may take any suitable form for the application, such as the forms discussed above with reference to the coupling components 1716. Although a single IC package 1720 is shown in FIG. 6, multiple IC packages may be coupled to the package interposer 1704; indeed, additional interposers may be coupled to the package interposer 1704. The package interposer 1704 may provide an intervening substrate used to bridge the circuit board 1702 and the IC package 1720. The IC package 1720 may be or include, for example, a die (the die 1502 of FIG. 5), an IC device, or any other suitable component. Generally, the package interposer 1704 may spread a connection to a wider pitch or reroute a connection to a different connection. For example, the package interposer 1704 may couple the IC package 1720 (e.g., a die) to a set of BGA conductive contacts of the coupling components 1716 for coupling to the circuit board 1702. In the embodiment illustrated in FIG. 6, the IC package 1720 and the circuit board 1702 are attached to opposing sides of the package interposer 1704; in other embodiments, the IC package 1720 and the circuit board 1702 may be attached to a same side of the package interposer 1704. In some embodiments, three or more components may be interconnected by way of the package interposer 1704.

In some embodiments, the package interposer 1704 may be formed as a PCB, including multiple metal layers separated from one another by layers of dielectric material and interconnected by electrically conductive vias. In some embodiments, the package interposer 1704 may be formed of an epoxy resin, a fiberglass-reinforced epoxy resin, an epoxy resin with inorganic fillers, a ceramic material, or a polymer material such as polyimide. In some embodiments, the package interposer 1704 may be formed of alternate rigid or flexible materials that may include the same materials described above for use in a semiconductor substrate, such as silicon, germanium, and other group III-V and group IV materials. The package interposer 1704 may include metal lines 1710 and vias 1708, including but not limited to through-silicon vias (TSVs) 1706. The package interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as RF devices, power amplifiers, power management devices, antennas, arrays, sensors, and microelectromechanical systems (MEMS) devices may also be formed on the package interposer 1704. The package-on-interposer structure 1736 may take the form of any of the package-on-interposer structures known in the art. In some embodiments, the package interposer 1704 may include one or more microelectronic packages with a bridge coupled with an inner layer of the package substrate.

The IC device assembly 1700 may include an IC package 1724 coupled to the first face 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC device assembly 1700 illustrated in FIG. 6 includes a package-on-package structure 1734 coupled to the second face 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

Figure 7:
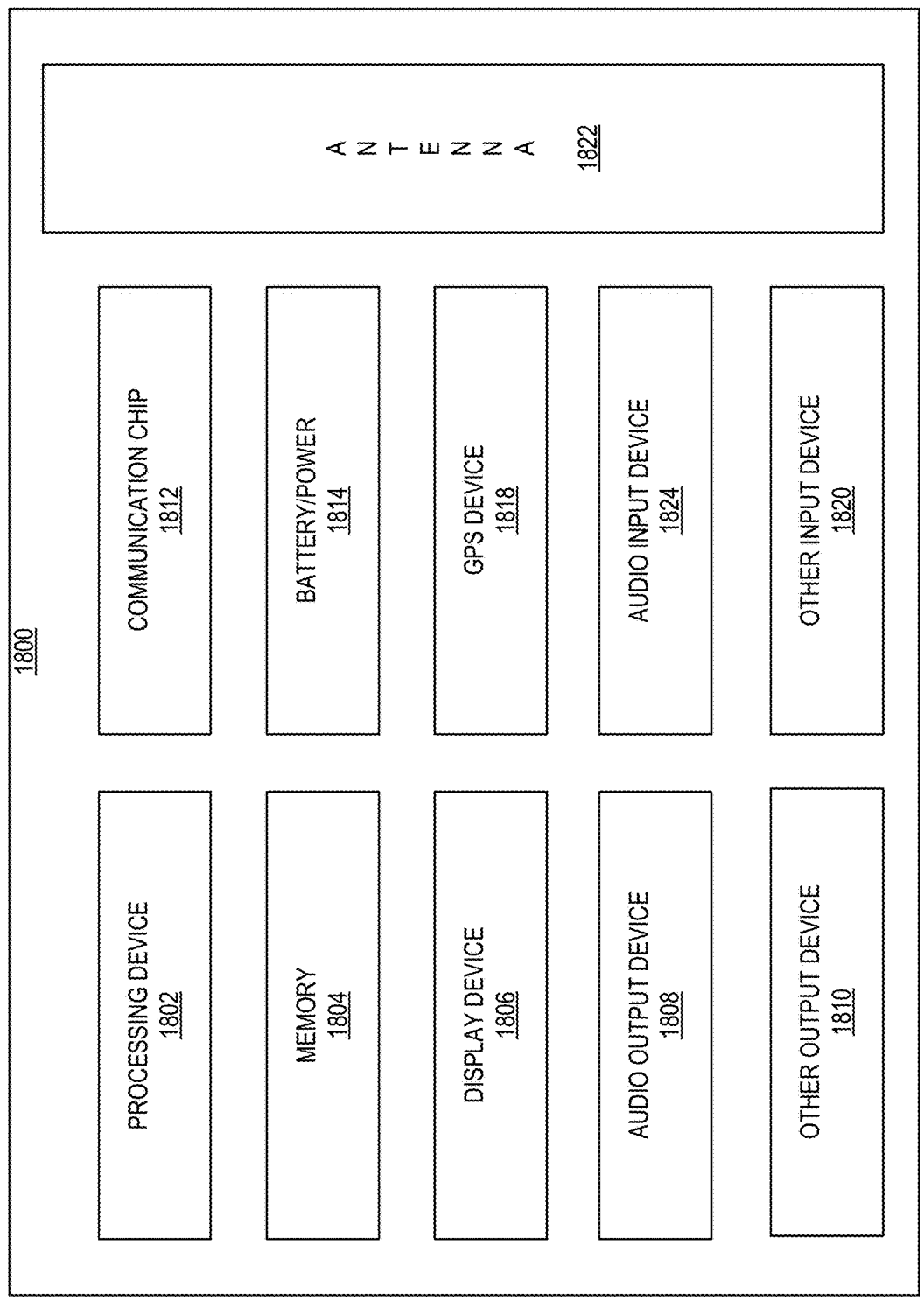
FIG. 7 is a block diagram of an example electrical device that may include a microelectronic package with a bridge coupled with an inner layer of the package substrate, in accordance with various embodiments.

FIG. 7 is a block diagram of an example electrical device 1800 that may include one or more microelectronic packages with a bridge coupled with an inner layer of the package substrate, in accordance with any of the embodiments disclosed herein. For example, any suitable ones of the components of the electrical device 1800 may include one or more of the IC device assemblies 1700, IC packages, IC devices, or dies 1502 disclosed herein. A number of components are illustrated in FIG. 7 as included in the electrical device 1800, but any one or more of these components may be omitted or duplicated, as suitable for the application. In some embodiments, some or all of the components included in the electrical device 1800 may be attached to one or more motherboards. In some embodiments, some or all of these components are fabricated onto a single system-on-a-chip (SoC) die.

Additionally, in various embodiments, the electrical device 1800 may not include one or more of the components illustrated in FIG. 7, but the electrical device 1800 may include interface circuitry for coupling to the one or more components. For example, the electrical device 1800 may not include a display device 1806, but may include display device interface circuitry (e.g., a connector and driver circuitry) to which a display device 1806 may be coupled. In another set of examples, the electrical device 1800 may not include an audio input device 1824 or an audio output device 1808, but may include audio input or output device interface circuitry (e.g., connectors and supporting circuitry) to which an audio input device 1824 or audio output device 1808 may be coupled.

The electrical device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific integrated circuits (ASICs), CPUs, GPUs, cryptoprocessors (specialized processors that execute cryptographic algorithms within hardware), server processors, or any other suitable processing devices. The electrical device 1800 may include a memory 1804, which may itself include one or more memory devices such as volatile memory (e.g., dynamic random-access memory (DRAM)), nonvolatile memory (e.g., ROM), flash memory, solid state memory, and/or a hard drive. In some embodiments, the memory 1804 may include memory that shares a die with the processing device 1802. This memory may be used as cache memory and may include embedded dynamic random-access memory (eDRAM) or spin transfer torque magnetic random-access memory (STT-MRAM).

In some embodiments, the electrical device 1800 may include a communication chip 1812 (e.g., one or more communication chips). For example, the communication chip 1812 may be configured for managing wireless communications for the transfer of data to and from the electrical device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The electrical device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The electrical device 1800 may include battery/power circuitry 1814. The battery/power circuitry 1814 may include one or more energy storage devices (e.g., batteries or capacitors) and/or circuitry for coupling components of the electrical device 1800 to an energy source separate from the electrical device 1800 (e.g., AC line power).

The electrical device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display.

The electrical device 1800 may include an audio output device 1808 (or corresponding interface circuitry, as discussed above). The audio output device 1808 may include any device that generates an audible indicator, such as speakers, headsets, or earbuds.

The electrical device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The electrical device 1800 may include a GPS device 1818 (or corresponding interface circuitry, as discussed above). The GPS device 1818 may be in communication with a satellite-based system and may receive a location of the electrical device 1800, as known in the art.

The electrical device 1800 may include another output device 1810 (or corresponding interface circuitry, as discussed above). Examples of the other output device 1810 may include an audio codec, a video codec, a printer, a wired or wireless transmitter for providing information to other devices, or an additional storage device.

The electrical device 1800 may include another input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1800 may have any desired form factor, such as a handheld or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server device or other networked computing component, a printer, a scanner, a monitor, a set-top box, an entertainment control unit, a vehicle control unit, a digital camera, a digital video recorder, or a wearable electrical device. In some embodiments, the electrical device 1800 may be any other electronic device that processes data.

EXAMPLES OF VARIOUS EMBODIMENTS

Example 1 includes a microelectronic package comprising: a substrate with a cavity therein; a component positioned within the substrate, wherein the component is exposed by the cavity; a solder bump positioned within the cavity such that the solder bump is coupled with the component; and a bridge die physically and communicatively coupled with the solder bump, wherein the bridge die is to facilitate transmission of an electronic signal between the component and a second component to which the bridge die is coupled.

Example 2 includes the microelectronic package of example 1, wherein the component is a conductive component of the substrate.

Example 3 includes the microelectronic package of example 1, wherein the component is an active component of the substrate.

Example 4 includes the microelectronic package of example 1, further comprising an active die coupled with the substrate by a second solder bump at a surface of the substrate.

Example 5 includes the microelectronic package of example 4, further comprising a solder resist at the surface of the substrate, wherein the solder resist surrounds the second solder bump.

Example 6 includes the microelectronic package of example 4, wherein the bridge die is coupled with the solder bump at a first side of the bridge die, and wherein the active die is coupled with a second side of the bridge die that is opposite the first side of the bridge die by a third solder bump.

Example 7 includes the microelectronic package of example 4, wherein the component is a conductive component of the substrate, and wherein the active die is communicatively coupled with the second component by the conductive component and the bridge die.

Example 8 includes the microelectronic package of any of examples 1-7, wherein the solder bump is physically and communicatively coupled with the component.

Example 9 includes the microelectronic package of any of examples 1-7, further comprising a metal pad within the cavity, wherein the metal pad is physically and communicatively coupled with the component, and wherein the solder bump is physically and communicatively coupled with the metal pad.

Example 10 includes an electronic device comprising: an electronic component coupled with a bridge of a microelectronic package; a substrate of the microelectronic package, wherein the substrate includes: a conductive element within the substrate; and a cavity in the first layer such that the conductive element is exposed within the cavity; a solder bump positioned within the cavity, wherein the solder bump is coupled with the bridge and the conductive element; and an active die coupled with a surface of the substrate such that the first die and the bridge are both adjacent to the surface of the substrate.

Example 11 includes the electronic device of example 10, wherein the active die is a processor.

Example 12 includes the electronic device of example 10, wherein the conductive element is a trace or a pad.

Example 13 includes the electronic device of any of examples 10-12, further comprising a pad in the cavity between the solder bump and the conductive element.

Example 14 includes the electronic device of any of examples 10-12, wherein the solder bump is coupled directly with the conductive element.

Example 15 includes a microelectronic package comprising: a substrate with an outer n layer and an inner n−1 layer adjacent to the n layer; a conductive element at the n−1 layer, wherein the conductive element is exposed by a cavity in the n layer; a bridge with a first side and a second side that is opposite the first side, wherein the bridge is communicatively coupled with the conductive element by a solder bump in the cavity at the first side of the bridge; and an active die physically coupled with the n layer of the substrate, wherein the active die is communicatively coupled with the bridge by the conductive element.

Example 16 includes the microelectronic package of example 15, wherein the bridge is a silicon bridge.

Example 17 includes the microelectronic package of example 15, wherein the bridge is an active bridge.

Example 18 includes the microelectronic package of example 15, wherein the bridge is a passive bridge.

Example 19 includes the microelectronic package of any of examples 15-18, wherein the active die is physically coupled with the second side of the bridge.

Example 20 includes the microelectronic package of example 19, wherein the active die is non-communicatively coupled with the second side of the bridge.

Example 21 includes a method of forming a microelectronic package, wherein the method comprises: forming, in the outer layer of the substrate, a cavity such that a component within the substrate is exposed within the cavity; positioning a solder ball within the cavity; positioning a bridge such that it is physically and communicatively coupled with the solder ball; and reflowing the solder ball such that the bridge is coupled with the component by the solder ball.

Example 22 includes the method of example 21, further comprising forming a via in the substrate such that a component at a surface of the substrate is communicatively coupled with a second component within the substrate by the via.

Example 23 includes the method of example 22, further comprising coupling an active die with the via such that the active die is on a same side of the substrate as the bridge.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated embodiments, including what is described in the Abstract, is not intended to be exhaustive or limiting as to the precise forms disclosed. While specific implementations of, and examples for, various embodiments or concepts are described herein for illustrative purposes, various equivalent modifications may be possible, as those skilled in the relevant art will recognize. These modifications may be made in light of the above detailed description, the Abstract, the Figures, or the claims.

The invention claimed is:

1. A microelectronic package comprising:
a substrate with a cavity therein, wherein the substrate comprises a plurality of layers;
a component positioned within the substrate, wherein the component is exposed by the cavity through the plurality of layers;
a bridge die physically and communicatively coupled with the component by an interconnect including a solder bump, within the cavity, coupled to the component and to the bridge die, wherein the bridge die is to facilitate transmission of an electronic signal between the component and a second component to which the bridge die is coupled, and wherein the bridge die is not within the cavity; and
a metal pad partially within the cavity, wherein the metal pad is physically and communicatively coupled with the bridge, wherein:
the solder bump is physically and communicatively coupled with the metal pad and the component; and
the solder bump is between the metal pad and the component.

2. The microelectronic package of claim 1, wherein the component is a conductive component of the substrate.

3. The microelectronic package of claim 1, further comprising an active die coupled with the substrate by a second solder bump at a surface of the substrate.

4. The microelectronic package of claim 3, further comprising a solder resist at the surface of the substrate, wherein the solder resist surrounds the second solder bump.

5. The microelectronic package of claim 3, wherein the bridge die is coupled with the solder bump at a first side of the bridge die, and wherein the active die is coupled with a second side of the bridge die that is opposite the first side of the bridge die by a third solder bump.

6. The microelectronic package of claim 3, wherein the component is a conductive component of the substrate, and wherein the active die is communicatively coupled with the second component by the conductive component and the bridge die.

7. The microelectronic package of claim 1, wherein the solder bump is physically and communicatively coupled with the component.

8. The microelectronic package of claim 1, wherein the substrate includes at least one additional layer to the plurality of layers exposed by the cavity.

9. An electronic device comprising:
an electronic component coupled with a bridge of a microelectronic package;
a substrate of the microelectronic package, wherein the substrate includes:
a plurality of layers;
a conductive element within the substrate; and
a cavity in a first layer of the plurality of layers of the substrate such that the conductive element is exposed within the cavity;
a solder bump positioned within the cavity, wherein the solder bump is communicatively coupled with the bridge and the conductive element;
a first metal pad in the cavity between the solder bump and the conductive element, wherein the solder bump is physically and communicatively coupled to the first metal pad;
a second metal pad partially within the cavity, wherein the second metal pad is physically and communicatively coupled with the bridge, wherein the solder bump is physically and communicatively coupled with the first metal pad and the second metal pad, and wherein the solder bump is between the first metal pad and the second metal pad; and an active die coupled with a surface of the substrate such that the active die and the bridge are both adjacent to the surface of the substrate, and wherein the bridge is not within the cavity.

10. The electronic device of claim 9, wherein the active die is a processor.

11. The electronic device of claim 9, wherein the conductive element is a trace or a pad.

12. A microelectronic package comprising:
a substrate with an outer N layer, an inner N-1 layer adjacent to the N layer, and an N-2 layer adjacent to the N-1 layer opposite the N layer;
a conductive element at the N-2 layer, wherein the conductive element is exposed by a cavity in the N and N-1 layers;
a bridge with a first side and a second side that is opposite the first side, wherein the bridge is communicatively coupled at the first side of the bridge with the conductive element by a solder bump within the cavity, and wherein the bridge is not within the cavity;

an active die physically coupled with the N layer of the substrate, wherein the active die is communicatively coupled with the bridge by the conductive element; and a metal pad partially within the cavity, wherein the metal pad is physically and communicatively coupled with the bridge, wherein:
the solder bump is physically and communicatively coupled with the metal pad and the conductive element; and
the solder bump is between the metal pad and the conductive element.

13. The microelectronic package of claim 12, wherein the bridge is a silicon bridge.

14. The microelectronic package of claim 12, wherein the active die is physically coupled with the second side of the bridge.

15. The microelectronic package of claim 14, wherein the active die is communicatively coupled with the second side of the bridge.

16. The microelectronic package of claim 12, wherein the substrate further includes an N-3 layer adjacent to the N-2 layer opposite the N-1 layer.

* * * * *